United States Patent
You Yang

(10) Patent No.: US 7,690,551 B2
(45) Date of Patent: Apr. 6, 2010

(54) DIE ATTACH BY TEMPERATURE GRADIENT LEAD FREE SOFT SOLDER METAL SHEET OR FILM

(75) Inventor: Ong You Yang, Pahang (MY)

(73) Assignee: ChipPAC, Inc., Fremont, CA (US)

( * ) Notice: Subject to any disclaimer, the term of this patent is extended or adjusted under 35 U.S.C. 154(b) by 1498 days.

(21) Appl. No.: 11/027,002

(22) Filed: Dec. 31, 2004

(65) Prior Publication Data
US 2005/0156325 A1    Jul. 21, 2005

Related U.S. Application Data

(60) Provisional application No. 60/533,955, filed on Dec. 31, 2003.

(51) Int. Cl.
*B23K 35/14*    (2006.01)
*H10L 29/40*    (2006.01)

(52) U.S. Cl. .............. 228/56.3; 228/124.6; 228/208; 257/783; 257/779; 438/106; 438/113

(58) Field of Classification Search ........... 228/56.3, 228/178, 179.1, 124.6, 208, 246; 156/331.5; 257/783, 782, 676, 736, 737, 779; 438/106, 438/113, 118, 123
See application file for complete search history.

(56) References Cited

U.S. PATENT DOCUMENTS

| | | | | |
|---|---|---|---|---|
| 5,386,141 | A * | 1/1995 | Liang et al. | 257/676 |
| 5,881,945 | A * | 3/1999 | Edwards et al. | 228/124.6 |
| 6,830,959 | B2 * | 12/2004 | Estacio | 438/113 |
| 6,873,059 | B2 * | 3/2005 | Amagai et al. | 257/783 |
| 6,955,947 | B2 * | 10/2005 | Dias et al. | 438/121 |
| 6,956,291 | B1 * | 10/2005 | Li | 257/778 |

* cited by examiner

*Primary Examiner*—Jessica L. Ward
*Assistant Examiner*—Michael Aboagye
(74) *Attorney, Agent, or Firm*—Robert D. Atkins

(57) ABSTRACT

A die attach process employs a temperature gradient lead free soft solder metal sheet or thin film as the die attach material. The sheet or thin film is formed to a uniform thickness and has a heat vaporizable polymer adhesive layer on one surface, by which the thin film is laminated onto the back metal of the silicon wafer. The thin film is lead-free and composed of acceptably non-toxic materials. The thin film remains semi-molten (that is, not flowable) in reflow temperatures in the range about 260° C. to 280° C. The polymer adhesive layer is effectively vaporized at the high reflow temperatures during the die mount.

11 Claims, 5 Drawing Sheets

DIE ATTACH BY TEMPERATURE GRADIENT LEAD FREE SOFT SOLDER METAL SHEET OR FILM

CROSS-REFERENCE TO RELATED APPLICATIONS

This application claims priority from U.S. Provisional Application No. 60/533,955, filed Dec. 31, 2003, titled "die attach by temperature gradient lead free soft solder metal sheet or film", which is incorporated by reference herein.

BACKGROUND

This invention relates to semiconductor packaging and, particularly, to attachment of the semiconductor die onto the lead frame or substrate in packaging power devices.

In power packages, the die is attached to the leadframe by affixing the backside of the die to the die paddle of the lead frame. Typically, electrical current is conducted from the backside of the die to the die paddle. Power devices consume a considerable amount of energy, and dissipate great amounts of heat. Accordingly, preferred die attach materials are highly heat conductive and electrically conductive and, generally, solders are preferred has die attach materials for power packages.

A conventional die attach method using a soft solder includes three in-line processes, namely: dispensing the solder, "spanking" the solder, and mounting the die onto the spanked solder. In the solder dispensing process, the solder is drawn into a wire, and a solder feeder using a vertical feed movement dispenses a droplet of molten solder from a supply onto a nickel-plated or bare copper lead frame die paddle in a heat tunnel of a die attach machine. In the solder spanking process, a "spanker" is used to flatten the molten droplet of solder so as to achieve an even spread of liquid solder in a desired rectangular shape over the die attach surface of the die paddle. The "spanked" solder typically has a size about 20% greater than the die size. In the die mounting process, a suction operated pick-and-place tool is used to pick up a singulated die from a sawn wafer and position the die backside downward upon the spanked solder. The solder is permitted to solidify in a cooling zone, completing the attachment.

A critical part of such a conventional process is achieving an even spread of solder, using a minimum quantity of solder. Die attach performance is degraded by solder voids, inadequate solder coverage, and nonuniform bond line thickness, and typically the process requires a lengthy setup time for spanker process buyoff to avoid these defects. Longer conversion in-line process times result in loss of productivity.

In one approach to improving the conventional process, a soft solder dispensing module is used to dispense the molten solder in a distributed pattern over the die attach surface of the die paddle. This requires additional setup and maintenance of the dispensing module, and the cost of maintenance can be high. Frequent change of the pattern mold casing may be required, and a cleaning station must be provided to clean solder residues in the pattern mold casing.

In another approach to improving the conventional process, a solder paste is employed in place of molten solder. The solder paste is dispensed onto the die attach surface of the die paddle, using a syringe dispenser or a "shower head" dispenser, or printing through a stencil. Then a pick-and-place tool is used to press the die onto the dispensed solder paste, and the solder paste is reflowed to complete the attachment. The dispenser can become clogged with solder paste, requiring cleaning. Solder paste can be difficult to control in processing; solder paste "bleed" can result in solder contamination on nearby contact sites, and the paste can creep onto and contaminate the top (active) surface of the die. Uniform bond line thickness can be difficult to obtain. Additional workstations are required, notably flux and in-line reflow stations, making the process more complex.

Various particular approaches to die attach have been proposed.

For example, U.S. Pat. No. 5,177,032 describes attaching a semiconductor die to a lead frame using a thermoplastic covered carrier tape. The thermoplastic is softened to a desired state by heating, the and the die is bonded to the lead frame by the thermoplastic. This approach is simpler than conventional methods using epoxy or a eutectic solder paste, but it is not useful for power packages. The thermoplastic material is not electrically conductive, so it cannot be used for die attach where electrical conduction from the backside of the die to the die paddle is required.

U.S. Pat. No. 5,904,504 describes attaching a semiconductor device to a printed layer of adhesive on the lead frame paddle using a recess template to create a dimensionally controlled imprint with a predetermined quantity of die attach adhesive. This approach includes melting the adhesive in a reservoir, requiring further equipment modification and setup control, and necessitating periodic cleaning of the reservoir. These requirements entail additional cost.

U.S. Pat. No. 4,454,840 describes a die attach adhesive that includes of a plurality of spacers in a suspension of silver filled glass. A solvent is driven from the silver filled glass during the die attach operation, causing the volume of the silver filled glass to decrease. The spacers are partially melted during thermal heating, so that the thickness of the spacers decreases, eventually forming a bond. This approach is costly, and requires extra handling of the solder material and other apparatus for die attach machine setup.

U.S. Pat. No. 6,525,423 describes using a plurality of wires as rigid spacers to support the die attach material, as an inexpensive means for achieving a uniform and consistent spacing between the die and the substrate. This approach is not suitable for power packages, as the wire spacers will restrict the flow of molten solder.

U.S. Pat. No. 6,524,891 describes pressure curing the die attach material, said to reduce voids in the die attach bondline. The additional step of pressure curing is a non-value added process for volume production manufacturing. An additional pressure chamber is also required to support this invented method.

Conventional soft solders include lead as a component. There is significant public concern regarding lead (Pb) and the use of lead-based materials, owing to effects on human health and the environment. Efforts are underway to developing suitable lead-free replacements for soft solder alloys. Most of the suitable lead-free alloys have generally higher reflow temperatures (for example, about 260° C.) than conventional lead-based soft solders (for example, about 220° C.). This can present challenges for manufacture of packages containing temperature sensitive semiconductor devices.

Certain power devices are thermally sensitive, and the die attach process for such devices must be conducted in a temperature regime that does not damage the die. For example, die attach for certain thermal sensitive metal-oxide-semiconductor field effect transistor (MOSFET) devices must be conducted at a mounting temperature below 300° C. As the die size of the MOSFET device is generally smaller than that of a bipolar junction transistor or other field effect transistor (less die area is required owing to high density), the integrated circuit built in the die is more sensitive to thermal induced stresses. Common thermally related defects are forward second breakdown, ionic contamination and hot surface charge spreading on the device surface.

Forward second breakdown occurs due to thermal runaway at a point in the aggregate transistors that operate under different conditions in a MOSFET. Because the resistivity of the silicon increases with temperature from ambient (in the die attach heat tunnel), the temperature rise causes the collector to become sticky, or may induce a thermal runaway defect in the device even before packaging assembly is completed.

Often the MOSFET (n-channel) is covered a with phosphosilicate glass (PSG) film so as to stabilize the threshold voltage against chances of ionic contaminants (sodium) due to high heat. Mobile charged ions present within the oxide or at the device-oxide interface will influence the device threshold voltage. Extra positive charge at the $SiO_2$ interface induces extra negative voltage in the n-channel, resulting in a decrease in the threshold voltage of the device. Charged devices will remain charged over a period of time, and the failure can start from the heat applied during the package assembly.

Surface charge spreading in MOSFET devices as a result of high ambient heat involves a lateral spreading of ionic charge from the biased metal conductors along the oxide layer or through moisture on the device surface. An inversion layer outside the active region of the transistor develops due to the charge forming a conduction path between the two diffused regions by an extension of the p-n junction through a high leakage region, resulting in leakage currents between the neighboring conductors. The rate of charge spreading increases with the temperature increment in the ambient, and can be stored in the inversion layer for some time. Overheating during die mounting can destroy the mounted MOSFET unit.

Accordingly, it is important in packaging temperature sensitive devices such as MOSFET power devices, to carry out the die attach at lower temperatures (below 300° C.) for some devices, and at the same time to achieve a uniform and desirable bond line thickness condition with higher die mounting units per hour.

SUMMARY

According to the invention, a die attach process employs a temperature gradient lead free soft solder metal sheet (which may be a thin film) as the die attach material. The sheet or thin film is formed to a uniform thickness and has a heat vaporizable polymer adhesive layer on one surface, by which the thin film is laminated onto the back metal of the silicon wafer. The thin film is lead-free and composed of acceptably non-toxic materials. The thin film remains semi-molten (that is, not flowable) in reflow temperatures in the range about 260° C. to 280° C. The polymer adhesive layer is effectively vaporized at the high reflow temperatures during the die mount.

The "temperature gradient" sheet (thin film), as that term is used herein, has a first ("upper") surface and a second ("lower") surface, and it is characterized by having a lower liquidus temperature in an upper portion, an intermediate liquidus temperature in a lower portion, and a higher liquidus temperature near the center, between the upper and lower portions. In some embodiments the thin film has a thickness 3 mils±0.2 mils as measured between the upper and lower surfaces. The thin film is formulated specifically to create adhesion between the die backmetal and the Ni-plated or bared Cu lead frame. In some embodiments the upper portion of the thin film consists of Sn—Ag—In alloy (liquidus temperature about 170° C.-180° C.), the medium portion consists of Sn—Ag—Cu (liquidus temperature around 220° C.-250° C.) and the lower portion is made up of Sn—Ag (liquidus temperature of 200° C.-210° C.).

In one general aspect the invention features a method for die attach using a temperature gradient lead free soft solder metal sheet or thin film, by laminating the thin film onto the backmetal of a silicon wafer, then dicing and cleaning the wafer to form singulated die each having the film affixed onto the backmetal, picking-and-placing a die onto a substrate (such as a lead frame or other substrate) and contacting the film on a die attach surface of the substrate (lead frame) under temperature conditions that effect bonding of the film onto the die attach surface of the substrate (lead frame). The substrate can be fed into preheated heating tunnel of a conventional die mounting machine, to a reflow temperature in a range up to about 280° C., so that bonding is effected nearly instantly upon contact of the die attach surface of the preheated substrate with the thin film on the backside of the die.

The thin film can be provided with a layer of a polymer that is effectively vaporized upon application of heat, and the thin film and its polymer layer can be laminated onto the silicon or silicon carbide wafer using an existing wafer laminator machine. Accordingly, in some embodiments the temperature gradient lead free soft solder metal sheet or thin film has a heat transient vaporized adhesive on one surface, which serves to affix the film onto the wafer backmetal during wafer dicing. In some embodiments the adhesive includes a polycarbonated condensed polyimide or distillate, and in some embodiments further includes acetophenone as a solvent and components that adjust thixotropy; the adhesive components are vaporized under elevated temperature of 180° C. and above during die mount reflow. Thixotropy adjustment components in the heat transient vaporized adhesive help to prevent poor outgassing during the reflow period once the adhesive is vaporized with the assistance of acetophenone.

In some embodiments the die is attached to a lead frame having a plurality of leads, ranging in number from 2 to 11; in some embodiments the die is attached to a substrate having a plurality of leads, ranging in number from 2 to 300.

In some embodiments the temperature gradient lead free soft solder metal sheet or thin film is provided in continuous roll form, and in some embodiments the roll has a width up to 12 inches; in some embodiments the roll is 3, 4, 5, 6, 8, or 12 inches wide. Or, the temperature gradient lead free soft solder metal sheet or thin film is provided in the form of a circle having about the same diameter as a standard wafer; in some embodiments the circular film is 3, 4, 5, 6, 8, or 12 inches in diameter.

The temperature gradient lead free soft solder metal sheet or thin film has a uniform thickness, and in some embodiments the film has a thickness at any point of 3 mils±0.2 mils.

According to the invention, the temperature gradient lead free soft solder metal sheet or thin film remains semi-molten during peak reflow time so as to hold the die within its placement position on the die paddle of a lead frame or substrate.

In some embodiments the temperature gradient lead free soft solder metal sheet or thin film has a gradual melting temperature profile from one surface to the other through the thickness of the film, with the highest melting temperature at the middle of the thin film (in some embodiments at about 250° C.) and lower melting temperatures at or adjacent the upper and lower surfaces of the film (at about 170° C. to 210° C.). Such temperature variation is produced by controlled precipitation of material elements during alloy fabrication, using a material diffractionary method.

In some embodiments the temperature gradient lead free soft solder metal sheet or thin film is made up of a quaternary tin (Sn) based soft solder (Sn—In—Ag—Cu), in which the composition varies in range and position as follows: an upper portion or region of the film comprises Sn—In—Ag (preferably 18-20% In, 2.5-3% Ag, the remaining % being Sn); a middle portion or region of the film comprises Sn—Ag—Cu (preferably 4-6% Ag, 1-2% Cu, the remaining % being Sn); a lower portion or region of the film comprises Sn—Ag (preferably 2-2.5% Ag, the remaining % being Sn). In some such embodiments the temperature gradient lead free soft solder metal sheet or thin film further includes as many as four or more intermetallic phases or compounds when used with Nickel-plated lead frame; and such intermetallic compounds can include $Ag_3In$, $Cu_6Sn_5$, $Ag_3Sn$ and $Ni_3Sn_4$ phases, among others.

In another general aspect, the invention features semiconductor packages including a die attached to a lead frame or substrate using a temperature-gradient soft solder metal sheet or film, and products containing such packages.

In some embodiments the die includes a heat-sensitive device and, particularly, a heat-sensitive power device; and in some embodiments the die is a MOSFET die.

In general, the invention can provide for significant improvements in manufacturability, inasmuch as the semiconductor package manufacture process is simplified, particularly at front of in-line processes owing to more rapid die attach. This can shorten the time-to-market meantime, and can reduce performance issues relating to the use of a conventional soft solder process.

The invention can be useful for die attach particularly in power packages, and where good electrical and thermal conduction between the backside of the die and die paddle are desired. The invention is particularly useful in packages including thermally sensitive devices, such as thermally sensitive power MOSFET packages.

Power packages made according to the invention can be useful in any of the variety of applications, including computers, network devices, consumer devices, and automotive and industrial applications.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1:
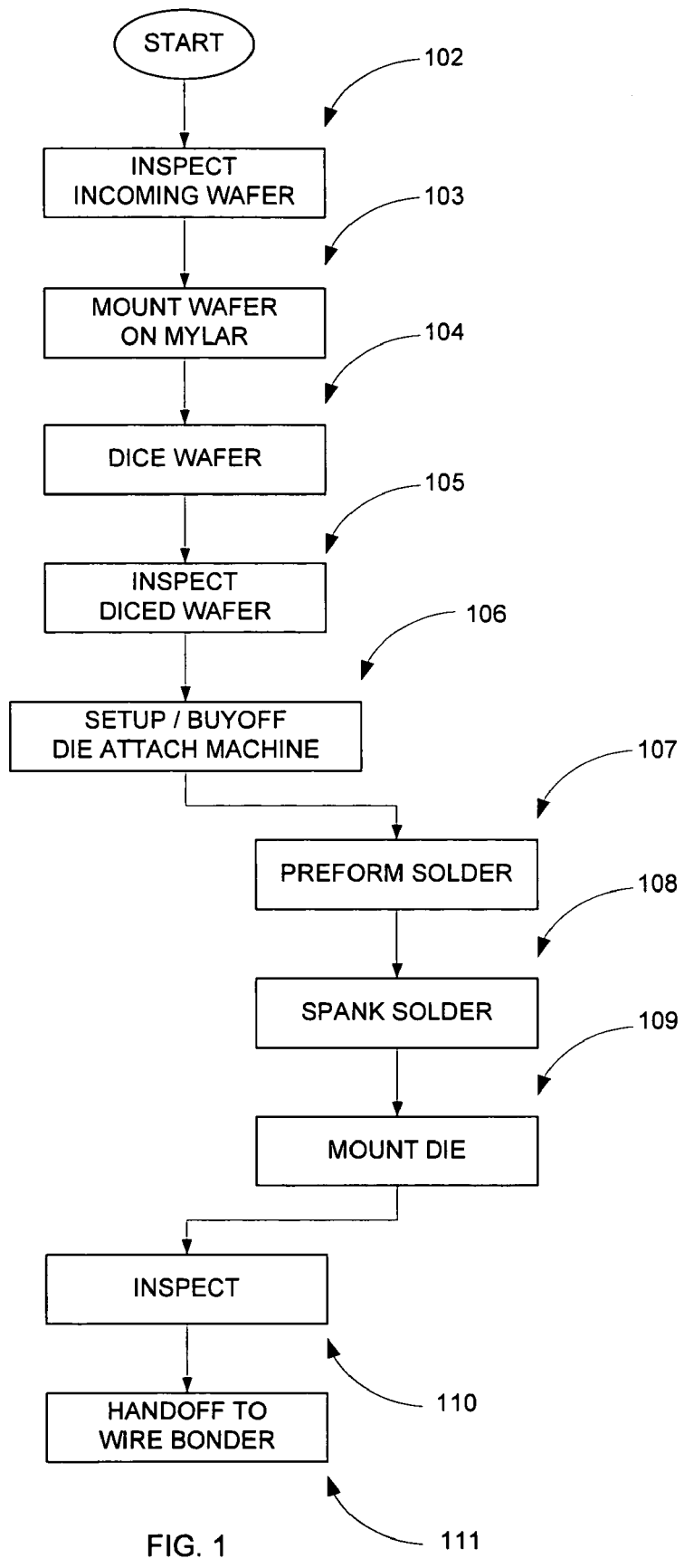
FIG. 1 is a flow diagram showing steps in a conventional die attach process.

Turning now to FIG. 1, there is shown a flow diagram of a conventional die attach process. The process flow begins with inspection 102 of a received wafer for surface contamination and scratches. The wafer is then mounted on a film carrier 103 (such as a Mylar® polyester film), and then the wafer is diced 104 to singulate the die, and again inspected 105. Then the wafer is passed on to the die attach process. In the conventional process, die attach begins with a die attach machine setup and buyoff 106, including setup of the solder dispensing unit, verification of preform location, spanker size adjustment, spanker co-planarity check and spanker co-planarity imprint verification, in addition to setup of the die mount area.

Following die attach machine setup and buyoff, there follows the die attach itself, including a solder preform step 107, a solder spanking step 108, and a die mounting step 109. Once the die mount is complete, the attached die is inspected 110 and, if it meets criteria, it is handed over 111 to the wire bond machine.

Figure 2:
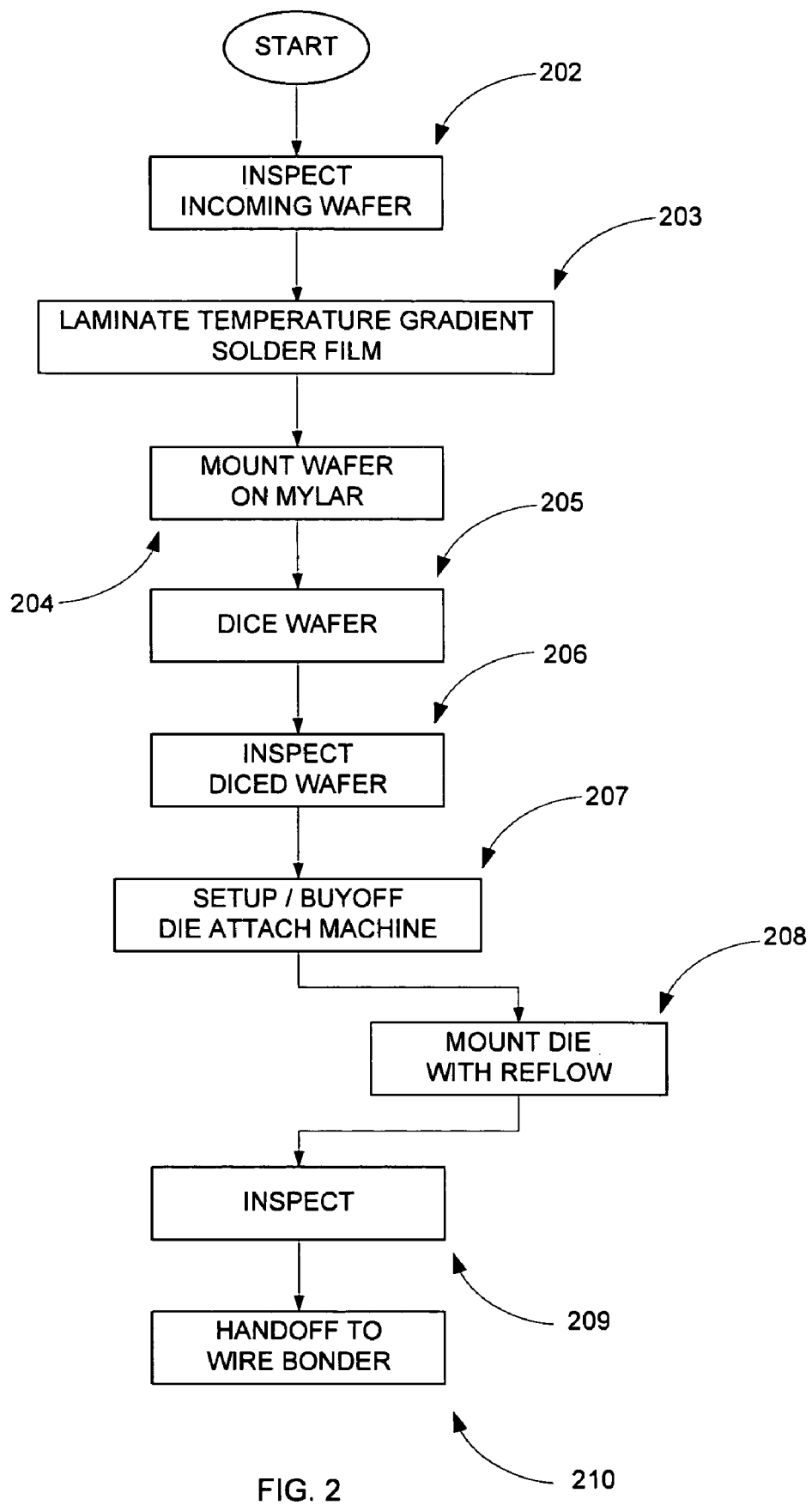
FIG. 2 is a flow diagram showing steps in a die attach process employing a temperature gradient solder film according to the invention.

Die attach process flow according to the invention is shown by way of example in the flow diagram in FIG. 2, and the parts are shown at various stages of assembly in diagrammatic sectional view in FIGS. 3A through 3G.

Here the process begins with inspection 202 of a received wafer for surface contamination and scratches. Then the temperature gradient lead free soft solder metal sheet or thin film is provided, having a desired thickness with a specified uniformity (such as, for example, 3 mils±0.2 mils), and is laminated 203 to the metallization on the backside of the wafer the "backmetal"). An adhesive polymer (34 in FIGS. 3A and 3B; 36 in FIGS. 3C and 3D) is provided on one surface (an "upper" surface) of the solder film (33 in FIGS. 3A and 3B; 35 in FIGS. 3C and 3D), to temporarily affix the solder film 33 to the wafer (31 in FIGS. 3A-3D) and thereafter to hold the solder film to the die following dicing, so that the solder film is carried on the die during the subsequent pick-and-place operation. The adhesive polymer (32 in FIGS. 3A-3D) is selected to provide sufficient adhesion to the wafer backmetal (32 in FIGS. 3A-3D) for the pick-and-place, and to be vaporizable at the reflow temperatures used during die mount. Suitable adhesives include, for example, polycarbonated distillates or hydrocarbon condensed polyimides containing acetophenone as a solvent and thixotropy adjustment components that evaporate at temperatures exceeding 180° C. The acetophenone assists in vaporizing hydrocarbon based polyimides, and the thixotropy components prevent poor outgassing of the material as it is vaporized. Preferably the adhesive has a greater adhesion strength than that of a conventional Mylar® wafer carrier, so that a subsequent pick- and place operation (described below) will separate the solder film from the Mylar®. The opposite surface of the solder film (the "lower" surface) preferably has a matted finish, to enhance attachment of the solder film to Mylar® during wafer sawing and thereby to avoid fly away of sawn die.

Figure 3A:
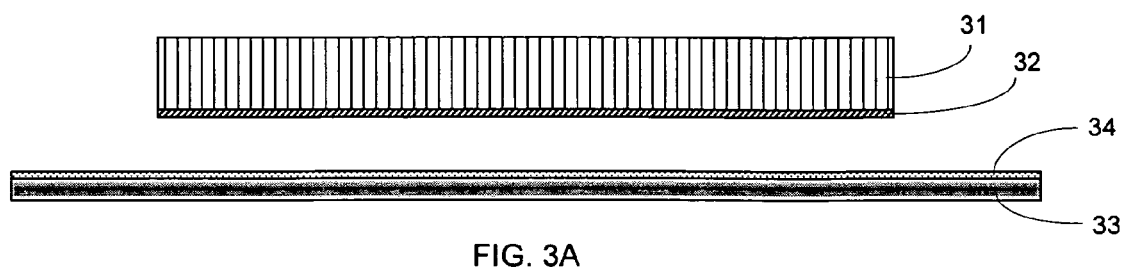
FIGS. 3A-3G are diagrammatic sketches in sectional view showing steps in a die attach process according to the invention.
Figure 3B:
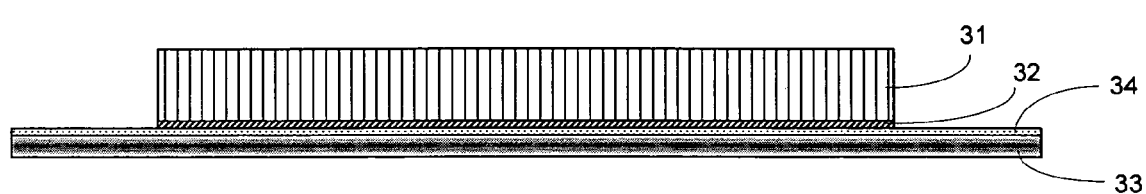
Figure 3C:
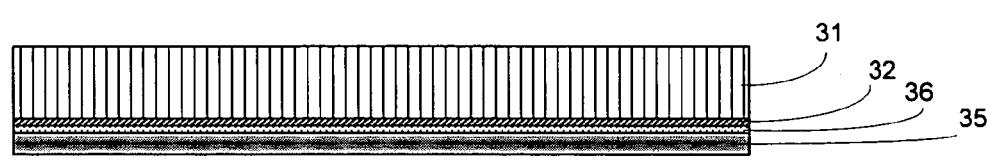

The film may be provided as a continuous roll, for example, having a width at least as wide as the diameter of the particular wafer, and the film may be cut to generally fit the wafer either prior to or following the lamination step. Or, the film may be provided in a size and shape that matches the wafer; the film may, for instance, be provided in circular units having diameters of standard wafer sizes: 2, 3, 4, 5, 6, 8 or 12 inches, for example. FIG. 3C shows a wafer 31 and wafer backmetal 32, affixed by the adhesive 36 to a solder film 35 sized to the wafer diameter.

Figure 3D:
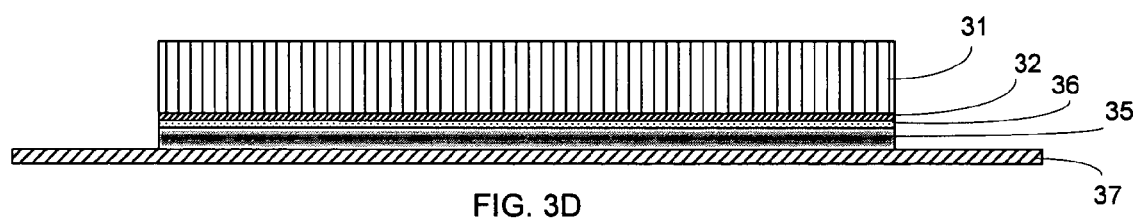
Figure 3D:
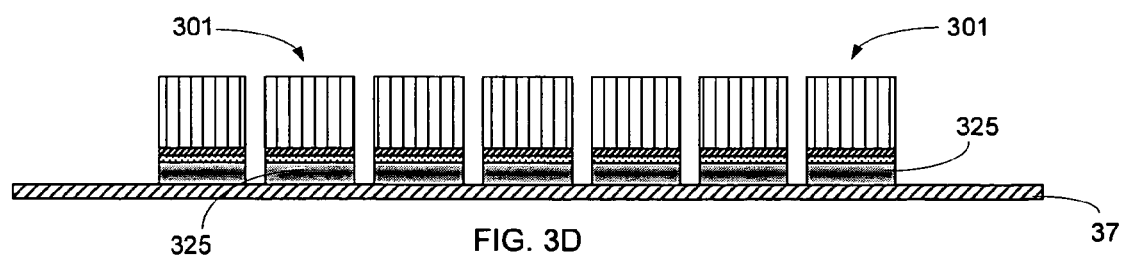
Figure 3E:
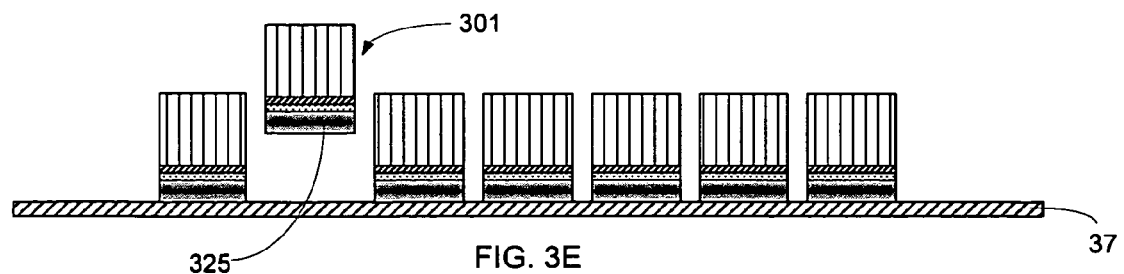
Figure 3F:
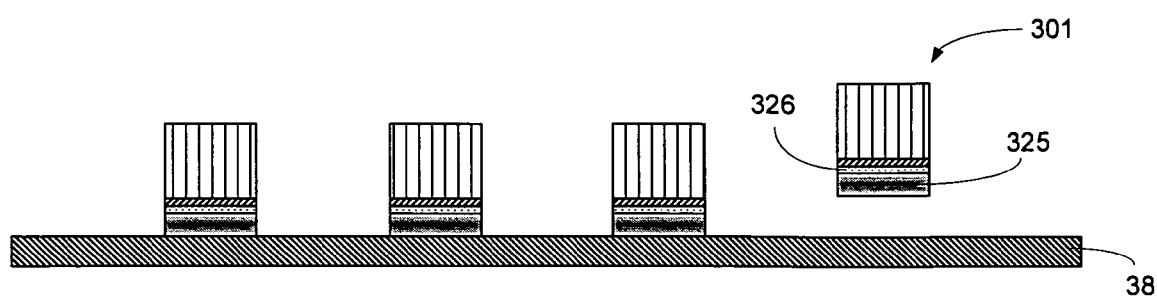
Figure 3G:
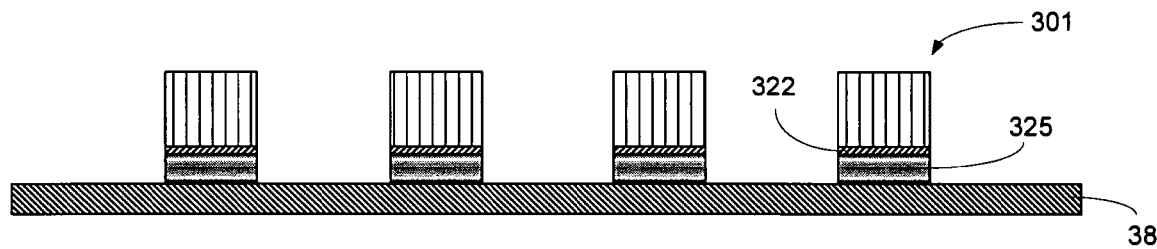

Then in a step 204 the wafer is mounted on a Mylar® carrier 37, as shown in FIG. 3D, and the wafer is sawn (diced, 205) to singulate the individual die (e.g., 301) and their associated solder films (e.g., 325). The diced wafer is then inspected, 206; Inspection criteria include verification of the integrity of the solder thin film, kerf width of the sawn junction and optical micrograph of the thin film surface condition.

Following inspection, the sawn wafer is passed on to the die attach process. Conversion of the die attach machine for a new device setup is easier and faster according to the invention as compared to conventional die attach processes. No solder dispensing unit setup, preform location verification, spanker size change, spanker co-planarity check or spanker imprint verification are required in the process of the invention. Routine setup of the die mount area is carried out at this step, for die auto-positioning with proper mount search height and Z placement height.

Following the die attach machine setup and buyoff, die mount with reflow is carried out, 208. In this step, the lead frame or substrate 38 is pre-heated to the reflow temperature (for example, 280° C.) in the heat tunnel of the die attach machine prior to die mounting. Then the singulated die (301 in FIGS. 3D-3F), laminated with the solder film (325 in FIGS. 3D-3F), is picked up from the Mylar® carrier 37 by a pick-and-place tool (not shown) having a rubber nozzle, and placed on the die attach location on the die paddle of a lead frame (38 in FIGS. 3F and 3G). Fast Z mount speed is applied (for example, <50 ms) so as to avoid premature melting of the temperature gradient lead free soft solder thin film. Bonding of the die occurs practically immediately upon die placement. The adhesive layer (326 in FIG. 3F) is vaporized after a few seconds at the reflow temperature in the heat tunnel.

The heat tunnel used in a conventional die attach machine for soft solder application also serves as a reflow tunnel for the thin film die attach according to the invention. This arrangement eliminates any need for a vertical reflow machine or for a flux chamber for cleaning and curing purposes. Accordingly, the invention can save time, cost and floor space occupancy in the fabrication facility.

An inspection 209 follows the die mount and reflow 208, and then the assembly is handed off 210 for wire bonding and subsequent steps in package completion.

EXAMPLE 1

Temperature Gradient Lead Free Soft Solder Film.

In some embodiments the temperature gradient lead free soft solder is fabricated into a thin film, with a thickness of 3 mils±0.2 mils. The film is formulated to create adhesion between the die backmetal and the Ni-plated or bared Cu lead frame. In some embodiments the upper portion of the thin film consists of Sn—Ag—In alloy (liquidus temperature about 170° C.-180° C.), the medium portion consists of Sn—Ag—Cu (liquidus temperature around 220° C.-250° C.) and the lower portion is made up of Sn—Ag (liquidus temperature of 200° C.-210° C.). This composition is fabricated using an element diffractionary method, in which the temperature gradient characteristic of the material is obtained via inhomogeneous chemical reaction and precipitation of solder composition to varying positions in the composite matrix. The film displays a gradual temperature transition across the thickness, with the highest range of temperature near or at the middle of the film. The center region of the film or sheet remains semi-molten (that is, it does not flow) during peak reflow temperature in the range of 280° C.

The film is functionally a gradient material, and is not a trimaterial (or a trilaminate) such as might be made by joining different materials. Trimaterials (or trilaminates) have a discontinuous transition between the layered materials, which can result in mismatches in coefficient of thermal expansion (CTE) and solder flake-off or separation. In a functionally gradient film, there is a gradual transition from one material to another, and this aspect is vital according to the invention, as it reduces CTE mismatch and can reduce solder flake-off and separation.

The solder precipitation process is controlled during fabrication of the film, and is profiled effectively to insure optimum distribution of silver, indium and copper contents in the metal sheet or thin film.

Figure 4:
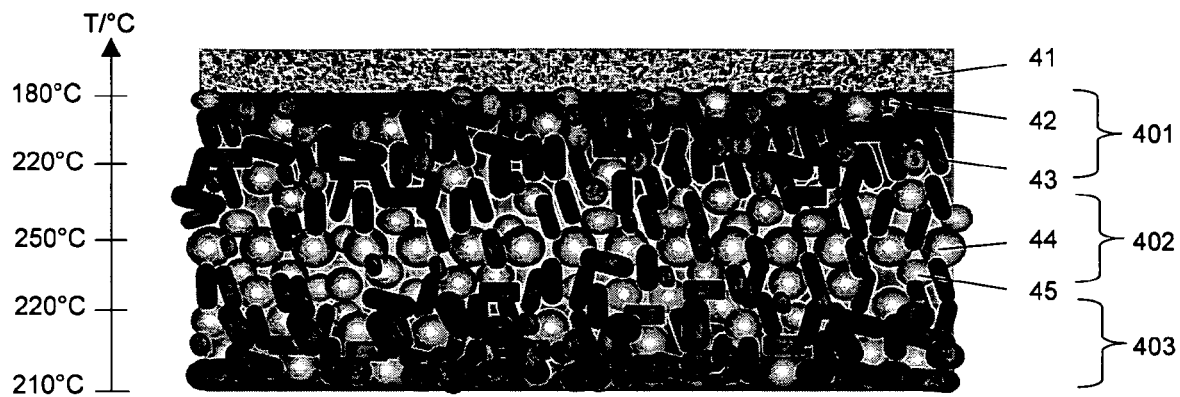
FIG. 4 is a diagrammatic sketch in a sectional view showing an example of a temperature gradient lead free soft solder metal sheet or film according to the invention.

The structure of the film, together with its overlying transient polymer adhesive, is illustrated by way of example in a diagrammatic sectional view in FIG. 4. The film has an upper region 401, having a lower melting point, a lower region 403, having a higher melting point, and a middle region 402, having an intermediate melting point. Each region may have a nominal thickness about 1 mil, for a total film thickness of about 3 mil. In one example, the upper region 401 is Sn—In—Ag, preferably consisting of 18-20% In, 2.5-3% Ag, and the remainder Sn, and having a melting point about 180° C.; the middle region 402 is Sn—Ag—Cu, preferably consisting of 4-6% Ag, 1-2% Cu, and the remainder Sn, and having a melting point about 250° C.; and the lower region 403 is Sn—Ag, preferably consisting of 2-2.5% Ag, and the remainder Sn, and having a melting point about 210° C. The various components of the film are represented symbolically in FIG. 4 as follows: 41, the transient polymer adhesive, which may be for example, a polycarbonate distillate, or a hydrocarbon condensed polyimide; 42, Indium (In), melting point 29.9° C.; 43, Tin (Sn), melting point 232° C.; 44, Silver (Ag), melting point 961° C.; 45, Copper (Cu), melting point 1084.6° C.

As will be appreciated, there is a gradual transition in composition and in melting temperature between the regions, as is illustrated generally by arrangement of the symbols representing the various components, and by the temperature scale at the left of FIG. 4. For simplicity the illustration does not show intermetallic phases. As will be further appreciated, at least 4 phases of intermetallic compounds would appear in an actual material cross sectional view, including for example $Ag_3In$, $Cu_6Sn_5$, $Ag_3Sn$ & $Ni_3Sn_4$; and still other intermetallic phases may exist depending on the precipitation control of the alloy during fabrication.

The thermal expansion coefficient of the film at the upper surface is well matched with that of the die backside; and the thermal expansion coefficient of the film at the lower surface is well matched with that of the die paddle. and the die one CTE mismatches are kept minimum with well control of the solder precipitation process during fabrication treatment, profiled effectively to insure optimum distribution of silver, indium and copper contents in the metal sheet/thin film.

The melting temperature gradient of a film as in the example of FIG. 4 has a temperature across the film thickness ranging from a low of about 170° C. to a high of about 250° C.

Inasmuch as the film consists in large portion of tin (Sn), a malleable characteristic with good elongation performance is achieved. Solder creep resistance is high owing to the presence of indium (In). Indium (In) also assists in lowering the melting point in the upper region adjacent the upper surface of the film. Silver (Ag) is scattered mainly in the middle of the film and is distributed scantily throughout the solder thickness from the upper to the lower surface so as to achieve continuous electrical and thermal conductivity capability. Copper (Cu) is added to assist in the redistribution of silver (Ag) as well as to enhance solder grittiness, stabilizing solder shear modulus and improved intermetallic phases between the Sn—In—Ag phase, the Sn—Ag—Cu phase, and the Sn—Ag phase. Tin (Sn) reacts well with any conventional die backmetal, such as a Ti/NiV/Ag or Ti/NiV/Au backmetal; and with a conventional lead frame surface such as a Ni-plated or bare copper lead frame.

EXAMPLE 2

Die Attach using Temperature Gradient Lead Free Soft Solder Film.

Figure 5:
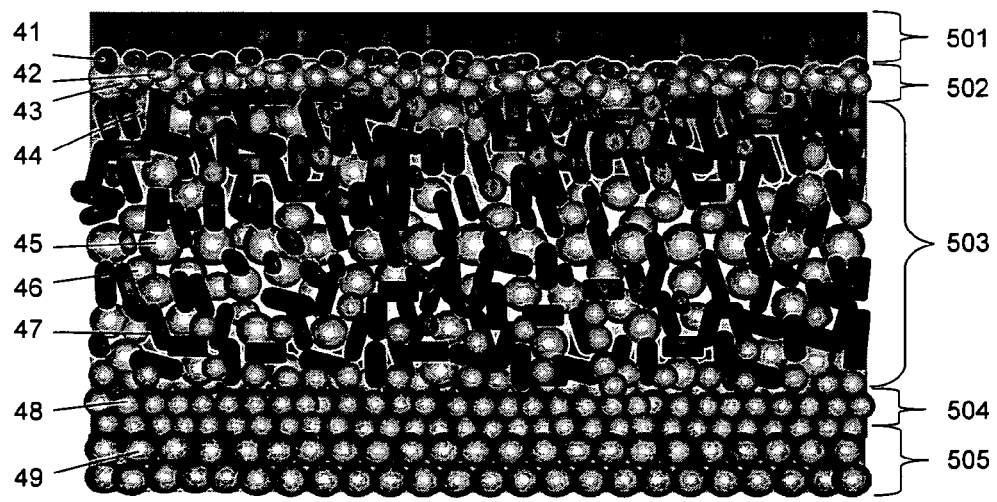
FIG. 5 is a diagrammatic sketch in a sectional view showing an example of a temperature gradient lead free soft solder metal sheet or film following die mount and reflow according to the invention, where the die has a Ti/NiV/Ag backmetal and the lead frame or substrate is Ni plated.

A portion of a die mounted on a lead frame is illustrated by way of example in a diagrammatic sectional view in FIG. 5. The temperature gradient lead free soft solder metal thin film 503 joins the die 501 (which in this example is provided with a backmetal 502), and the copper lead frame (which in this example has a nickel plating 504 on the lead frame core material 505). In this example the backmetal is an Ag finished Ti/NiV/Ag. The various components of the assembly are represented symbolically in FIG. 5 as follows: 51, Titanium (Ti); 52, Nickel Vanadium (NiV); 53, Silver (Ag) from the backmetal; 54, Indium (In) and its intermetallic compound; 55, Silver (Ag) and it intermetallic compound; 56, Copper (Cu) and its intermetallic compound; 57, Tin (Sn) and its intermetallic compound; 58, Nickel (Ni) plating on the lead frame and its intermetallic compound; 59, the Copper (Cu) core material of the lead frame or substrate. Inter-diffusion occurs when the film is subjected to a reflow temperature as high as 280° C., and, as illustrated, intermetallic phase migration occurs owing to inter-diffusion at elevated temperature.

Methods according to the invention can provide significant advantages.

For example, die attach according to the invention requires lower temperatures, so that the energy budget for the process can be reduced. Particularly, for example, the maximum reflow temperature required for on-line curing of the temperature gradient lead free soft solder metal sheet or thin film of the invention is about 280° C., which is 32% lower than the die attach temperatures of 360° C.-370° C. employed in conventional lead based soft solder.

Moreover, at lower reflow temperatures according to the invention the heat impact on the die itself is reduced, so that the incidence of heat related deficiencies can be reduced for heat sensitive dies, such as MOSFET devices. Heat related deficiencies include thermal runaway, forward second breakdown, ionic contamination and hot surface charge spreading. Such effects can be reduced according to the invention, to improve assembly yield.

Because no solder preform or spanking step is required, the invention provides a significant improvement in unit processing rate (units per hour). Elimination of the dispensing and spanking steps can increase machine throughput.

Moreover, because no solder dispensing or spanking is required according to the invention, the invention can provide for minimization of conversion, setup and buyoff time for the die attach process. There is no solder wire feeding time, no spanker installation and verification time, and to spanker imprint buyoff or other such process quality setup procedure.

The uniform thickness of the soft solder metal sheet or film according to the invention provides for a specifiable uniform thickness in the resulting bond line. Lamination of the sheet or thin film to the wafer prior to die singulation can provide a uniform and specified bond line thickness (for example, in the range 2.8 mils to 3.2 mils for a 3 mil nominal thickness), and a reduction of solder voids in the bondline.

The alloy composition of a soft solder metal sheet or thin film can be selected to provide excellent twistability to the surface of the die the die paddle, and low mismatch of thermal expansion coefficient with the die and lead frame materials. Moreover, the continuous temperature gradient film or sheet can provide for thermal expansion compliance between the die and the substrate or lead frame.

Because no molten solder is employed in the process, solder splash can be effectively eliminated, avoiding contamination on the lead frame header. Strong adhesion of the thin film or sheet with the die backmetal is carried out by lamination at the wafer level, where conditions can be readily adjusted to reduce void formation. Nucleation of voids during the die attach process is reduced, as unattended air entity is practically nil.

All patents and patent applications referred to above are hereby incorporated herein by reference.

Other embodiments are within the scope of the invention.

For example, as will be apparent, certain of the steps in the process according to the invention can be carried out in different sequence, depending on particular production shop-floor process and equipment requirements.

The material composition of the lead free temperature gradient soft solder metal sheet/thin film alloy composition may also be varied, where sample optimization is required. Also, the soft solder metal sheet/thin film can be fabricated into a rectangular roll form or in individual round wafer shape of any of various sizes, such as circles having diameters 3, 4, 5, 6, 8 and 12 inches.

What is claimed is:

1. A method of manufacturing a semiconductor device, comprising:

providing a semiconductor wafer;

providing a temperature gradient lead free soft solder metal film having a film alloy composition, a higher melting temperature near a middle portion of the solder metal film, and a lower melting temperature near first and second surfaces of the solder metal film;

forming a heat vaporizable polymer adhesive layer over the solder metal film;

mounting the semiconductor wafer to the polymer adhesive layer over the solder metal film;

dicing the semiconductor wafer and solder metal film to form a solder metal film laminated semiconductor die;

providing a leadframe having a die paddle;

pre-heating the leadframe to a reflow temperature above the melting temperature of the middle portion of the solder metal film prior to mounting the solder metal film laminated semiconductor die to the die paddle of the leadframe; and mounting the solder metal film laminated semiconductor die to the die paddle of the pre-heated leadframe in less than 50 milliseconds to avoid melting of the polymer adhesive layer before making contact between the solder metal film laminated semiconductor die and the die paddle of the pre-heated leadframe, wherein the reflow temperature of the leadframe raises the middle portion and first and second surfaces of the solder metal film above the respective melting temperatures and the polymer adhesive layer is completely vaporized at the reflow temperature after mounting the solder metal film laminated semiconductor die to the die paddle of the leadframe.

2. The method of claim 1, wherein the polymer adhesive layer includes polycarbonated distillates or hydrocarbon condensed polyimides that evaporate at temperatures exceeding 180 degrees C.

3. The method of claim 1, further including mounting the heat vaporizable polymer adhesive layer of the solder metal film to a backmetal surface of the semiconductor wafer.

4. The method of claim 1, wherein the melting temperature of the middle portion of the solder metal film is 250 degrees C.

5. The method of claim 1, wherein the reflow temperature ranges from 260 to 280 degrees C.

6. The method of claim 1, wherein the melting temperate of the first surface of the solder metal film is 180 degrees C. and the melting temperate of the second surface of the solder metal film is 210 degrees C.

7. A method of manufacturing a semiconductor device, comprising:
   providing a semiconductor wafer;
   providing a solder metal film;
   forming a heat vaporizable polymer adhesive layer over the solder metal film;
   mounting the semiconductor wafer to the polymer adhesive layer over the solder metal film;
   dicing the semiconductor wafer and solder metal film to form a film laminated semiconductor die;
   providing a leadframe having a die paddle;
   pre-heating the leadframe to a reflow temperature above a melting temperature of the solder metal film; and
   mounting the film laminated semiconductor die to the die paddle of the leadframe, wherein the reflow temperature of the leadframe raises the solder metal film above its melting temperature and the polymer adhesive layer is completely vaporized at the reflow temperature after mounting the solder metal film laminated semiconductor die to the die paddle of the leadframe.

8. The method of claim 7, wherein the solder metal film has a film alloy composition, a higher melting temperature near a middle portion of the solder metal film, and a lower melting temperature near a first and second surface of the solder metal film.

9. The method of claim 8, wherein the melting temperate of the middle portion of the solder metal film is 250 degrees C.

10. The method of claim 8, wherein the melting temperate of the first surface of the solder metal film is 180 degrees C. and the melting temperate of the second surface of the solder metal film is 210 degrees C.

11. The method of claim 7, wherein the reflow temperature ranges from 260 to 280 degrees C.

* * * * *